(12) United States Patent
Seitz et al.

(10) Patent No.: US 6,383,691 B1
(45) Date of Patent: May 7, 2002

(54) PHOTOMASK AND METHOD FOR INCREASING IMAGE ASPECT RATIO WHILE RELAXING MASK FABRICATION REQUIREMENTS

(75) Inventors: Mihel Seitz, Wappingers Falls, NY (US); Gerhard Kunkel, Radebeul (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/602,717

(22) Filed: Jun. 26, 2000

(51) Int. Cl.$^7$ ................................................ G03F 9/00
(52) U.S. Cl. ........................................ 430/5; 430/396
(58) Field of Search ................................ 430/5, 396

(56) References Cited

U.S. PATENT DOCUMENTS 6,042,973 A    3/2000  Pierrat
6,114,071 A  * 9/2000  Chen et al. ..................... 430/5
6,114,074 A  * 9/2000  Carpi et al. ..................... 430/5
6,258,489 B1 * 7/2001  Stanton et al. ................. 430/5

* cited by examiner

Primary Examiner—John A. McPherson

(57) ABSTRACT

A photomask for lithographic processing, in accordance with the present invention, includes a plurality of features for providing an image pattern. The features are arranged in a column on a mask substrate. Each feature is dimensioned to provide an individual image separate from all other images provided by the photomask when exposed to light. A line feature is formed on the mask substrate and extends between and intersects with each of the plurality of features in the column. The line feature extends a length of images produced by the plurality of features arranged in the column when exposed to light wherein the images produced by each of the plurality of features and the line feature remain separate from each other.

23 Claims, 5 Drawing Sheets

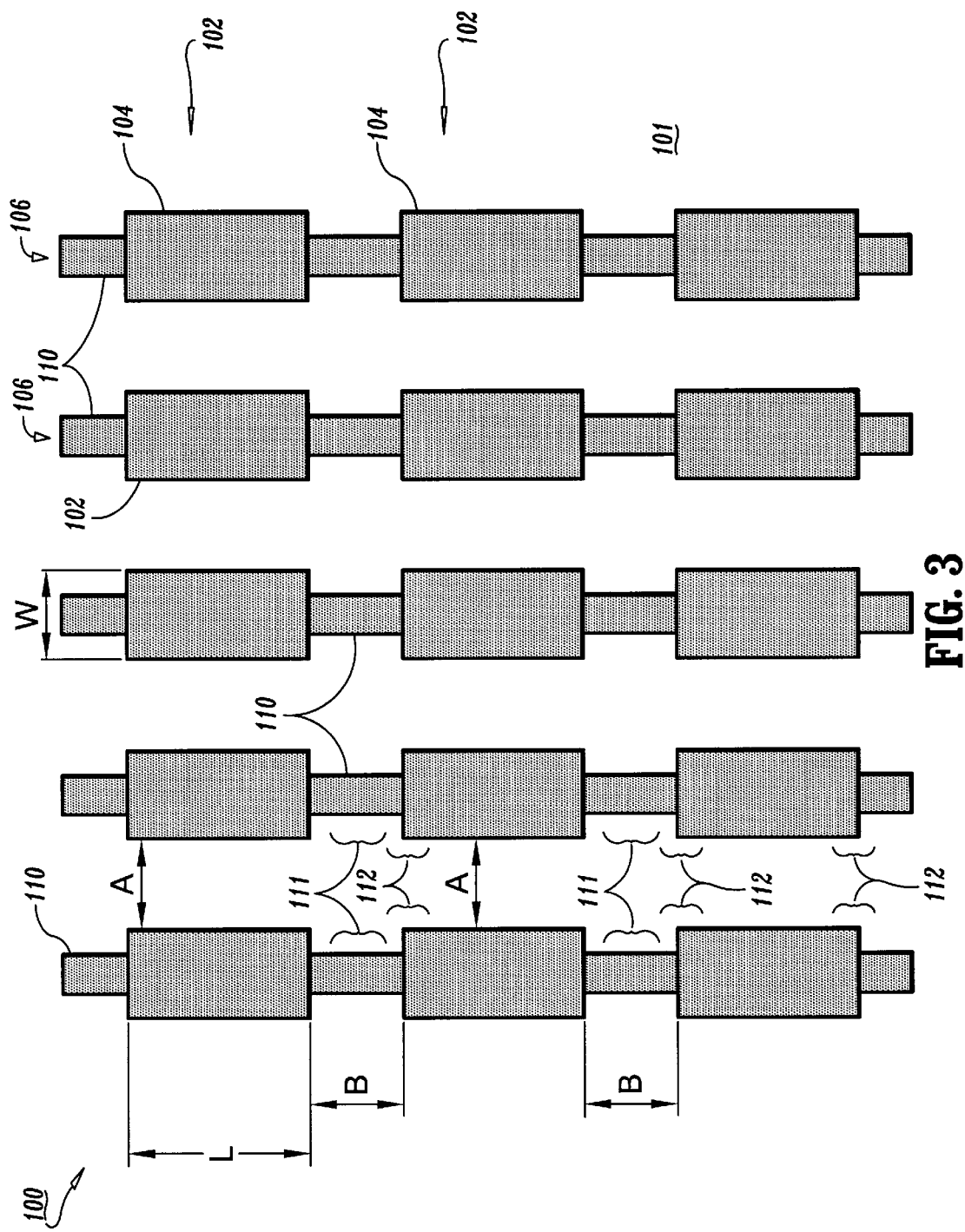

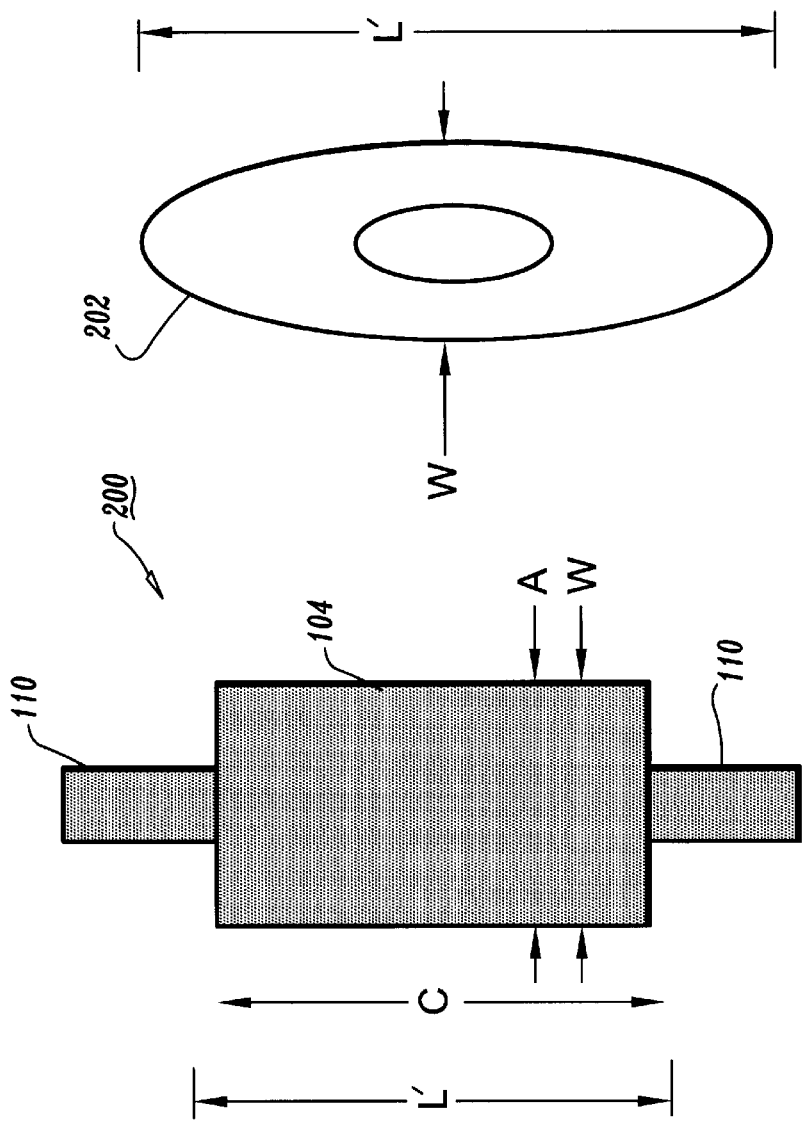

PHOTOMASK AND METHOD FOR INCREASING IMAGE ASPECT RATIO WHILE RELAXING MASK FABRICATION REQUIREMENTS

BACKGROUND

1. Technical Field

This disclosure relates to semiconductor fabrication, and more particularly, to a photomask and method for increasing the aspect ratio of photomask images by employing an assist line.

2. Description of the Related Art

Semiconductor fabrication processes typically include photolithography processes for providing images in a resist material. A resist material is spun onto or otherwise applied to a surface of a layer or layers to be patterned. The resist is exposed to radiation (e.g., light or electrons) to affect the cross-linking properties or to alter the chemistry of the resist in such a way as to render it removable in portions. The portions of the resist are designated as removable by employing a mask for the radiation (e.g., a light or electron mask) which controls the placement of the radiation (e.g., where the radiation falls) on the resist layer.

In high density electronic circuits, it is advantageous not to shrink dimensions of certain elements. For example, contact holes, which shunt a device on a wafer surface with subsequent low resistance metals, are an orifice for current flow. Therefore, a contact with large area is desired. One option to increase the contact size is to draw the contact larger on the photomask. This biasing of the mask compensates for all mechanisms leading to a deviation from the original mask dimensions by providing an offset, which leads to a corrected image. These offsets are normally defined in an iterative way and are strongly dependent on the environment of the features on the photomask, e.g., nested features versus isolated features. In a nested array, the ability to apply biases on the photomask is limited to resolve neighboring features. Another significant limit for applying biases on the photomask is the necessity to resolve and inspect spaces between the features on the actual mask.

Referring to FIG. 1, photo mask features 10 are shown for forming images of deep trenches in a photoresist. In this example, a feature 10 includes a rectangular structure having a length L equal to 2 minimum feature sizes (e.g., 2F) and a width of 1 minimum feature size (e.g., IF). Spacings "s", in FIG. 1, are dimensioned as a minimum feature size F. An image projected by the deep trench feature 10 produces a contrast plot as shown in FIG. 2. FIG. 2 is a typical shape of a deep trench image formed by employing feature 10. Iso-contrast line 12 shows the outline of a trench formed in accordance with feature 10 of FIG. 1. Contrast line 12 barely achieves the desired 2:1 aspect ratio of the deep trench. Since spacings between deep trenches are typically one minimum feature size, in order to avoid merging of the features with worst case critical dimension variations, the spacing of features 10 must be carefully monitored to provide an appropriate spacing between two features 10 on the photomask. The spacing accuracy is very tight and includes small spacing tolerances. The inspectable distance between two features or shapes is no smaller than, for example, 120 nm in a one-time image reduction. Consequently, in a 4x-reticle the minimum distance of two shapes is 480 nm.

Therefore, a need exists for a method and apparatus for increasing the image size and process window for exposing features to be patterned in a resist layer.

SUMMARY OF THE INVENTION

A photomask for lithographic processing, in accordance with the present invention, includes a plurality of features for providing an image pattern. The features are arranged in a column on a massk substrate. Each feature is dimensioned to provide an individual image separate from all other images provided by the photomask when exposed to light. A line feature is formed on the mask substrate and extends between and intersects with each of the plurality of features in the column. The line feature extends a length of images produced by the plurality of features arranged in the column when exposed to light wherein the images produced by each of the plurality of features and the line feature remain separate from each other.

A photomask for imaging a trench pattern in a resist layer includes a plurality of trench features arranged in rows and columns on a mask substrate. Each feature is dimensioned to provide an individual image separate from all other images provided by the photomask. Line features are formed on the mask substrate and extend between each of the trench features in each column. The trench features and the line features comprise an image pattern, wherein upon exposure to light of the image pattern, images of the line features extend a column-wise length of images produced by the trench features while the images of each of the trench features remain separate from each other.

In other embodiments, the plurality of features on the mask substrate are preferably spaced apart from neighboring features in the column by greater than a spacing dimension, and the images produced by the plurality of features appear to have the plurality of features separated by the spacing dimension. The line feature may include a width to provide an image of less than a groundrule dimension of a given technology. The plurality of features may include patterns for forming deep trenches or contact holes. The line feature may include a width which is discernable in an image of the photomask adjacent to an intersection point between the features and the line feature, but which is not discernable in the image of the photomask at middle portions of spacings between adjacent features in the column. The plurality of features may be symmetrically or asymmetrically disposed about the line feature. The trench features may include a length, and the images produced by the trench features and the line feature may be such that the trench features appear to be up to 20% longer than the length.

A method for relaxing image placement tolerances for a photomask, in accordance with the present invention, includes the steps of providing a photomask including a plurality of features for providing an image pattern, the features being arranged in a column on a mask substrate, each feature being dimensioned to provide an individual image separate from all other images provided by the photomask, and a line feature for the image pattern, the line feature being formed on the mask substrate and extending between each of the plurality of features in the column, the line feature for extending images produced by the plurality of features arranged in the column wherein the images of each of the plurality of features remain separate from each other, and directing light through the photomask onto a resist layer to expose the resist layer in accordance with a pattern provided by the photomask, such that images of the plurality of features are extended in the direction of the column due to the line feature.

In other methods, the step of providing may include the step of spacing the plurality of features on the substrate from neighboring features in the column by greater than a spacing dimension wherein the images produced by the plurality of features appear to be separated by the spacing dimension. The line feature may include a width less than a groundrule dimension of a given technology. The plurality of features may include patterns for forming one of deep trenches and contacts holes. The step of providing may include the step of providing a width of the line feature which is discernable in an image of the photomask adjacent to an intersection point between the features and the feature line, but which is not discernable in the image of the photomask at middle portions of spacings between adjacent features in the column. The step of providing may include the step of providing the plurality of features symmetrically or asymmetrically about the line feature. The method may further include the step of adjusting a width of the line feature to alter a length of the plurality of features.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 3 is a layout view of a photomask employing an assist line in accordance with the present invention;

FIG. 6 is a layout showing a deep trench photomask feature in accordance with the present invention;

FIG. 7 is a contrast plot showing a deep trench image produced by the feature shown in FIG. 6 in accordance with the present invention; and FIG. 8 is a layout showing a deep trench photomask feature having an assist line asymmetrically disposed relative a feature (304) in accordance with the present invention.

DETAILED DESCRIPTION OF PREFERRED EMBODIMENTS

Figure 2:
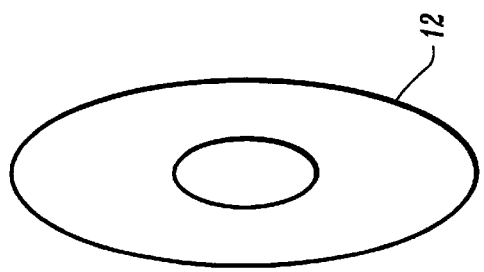
FIG. 2 is a contrast plot showing a deep trench image produced by one of the features shown in FIG. 1 in accordance with the prior art.

The present invention provides a non-intrusive method for altering the aspect ratio of lithographically printed features. The present invention is particularly useful for semiconductor fabrication processes. In one embodiment, a sub-groundrule line is employed on a photomask to increase the length of a patterned feature without increasing its width. In one illustrative example, the feature to be patterned in a resist layer includes a deep trench or a contact. Advantageously, in accordance with the present invention, the shapes or features formed on the photomask may be made smaller and provided with greater dimensional leeway or tolerance. In other words, shapes imaged on a wafer can be made closer without merging the shapes, and while increasing placement tolerances on the photomask (e.g., providing the capability of inspecting spaces between the shapes). Although the present invention will be described in terms of a deep trench, the present invention should not be construed as limited to the illustrative example and may be employed for other features as well.

Referring now in specific detail to the drawings in which like reference numerals identify similar or identical elements throughout the several views, and initially to FIG. 3, a portion of a deep trench (or contact hole) photomask 100 is illustratively shown, referred to generally, hereinafter as mask 100. Mask 100 preferably includes a chrome-on-glass (COG) photomask, although other mask types may benefit from the present invention. In accordance with the invention, features 104 are arranged in rows 102 and columns 106 (or vice versa) on a substrate 101, for example, a glass substrate. Features 104 may be employed for patterning deep trenches or contact holes or vias. Illustrative spacings A and B are shown between features 104. Spacing A may include a multiple of minimum feature size, F (where F is the groundrule for a given technology). F may be, for example, 0.135 microns, or 0.110 microns or any other minimum feature size. Photomask images are reduced on the wafer (e.g., by 4 or 5 times). Spacing B will be described in further detail below.

A feature 110 preferably includes an assist line, which extends across the array of trench features 104 and is dimensioned such that sub-groundrule images are projected to a wafer. Feature 110 is dimensioned such that feature 110 at mid-sections 111 is not discernable in an image of mask 100 on a wafer. In a preferred embodiment, a width of feature 110 is made as wide as possible without mid-sections 111 of feature 110 being discernable in an image (i.e., not being printable on a wafer). However, feature 110 is discernable in an image (See FIG. 4) near an intersection region 112 where feature 104 and feature 110 meet. Advantageously, this provides an image shape longer in one direction, when a resist layer is developed, and therefore provides a final trench structure with a higher aspect ratio compared to a maximum biased shape without using an assist line.

The present invention takes advantage of the fact that features below a certain dimension will not be printed as drawn. For example, feature 110 is dimensioned such that its printable image is, for example, between about 20% and about 55% of the minimum feature size. On a photomask, dimensions may be four or five times magnified as compared to design dimensions (e.g., dimensions formed on a wafer). In one preferred embodiment, feature 110 has a width of about 240 nm on photomask (this dimension would be reduced by, for example, 4 times on the wafer, i.e., printed at 60 nm) Feature 110 runs through features 104. With dimensions of about this size, feature 110 in mid-sections 111 is not transferred to a resist with mask 100, because the exposure conditions for the nominal dimensions of feature 110 are sub-groundrule and will not be resolved in these areas (111). Instead, feature 110 makes the transferred image of trench features 104 longer (increase L) while maintaining W and not merging features 104.

Figure 1:
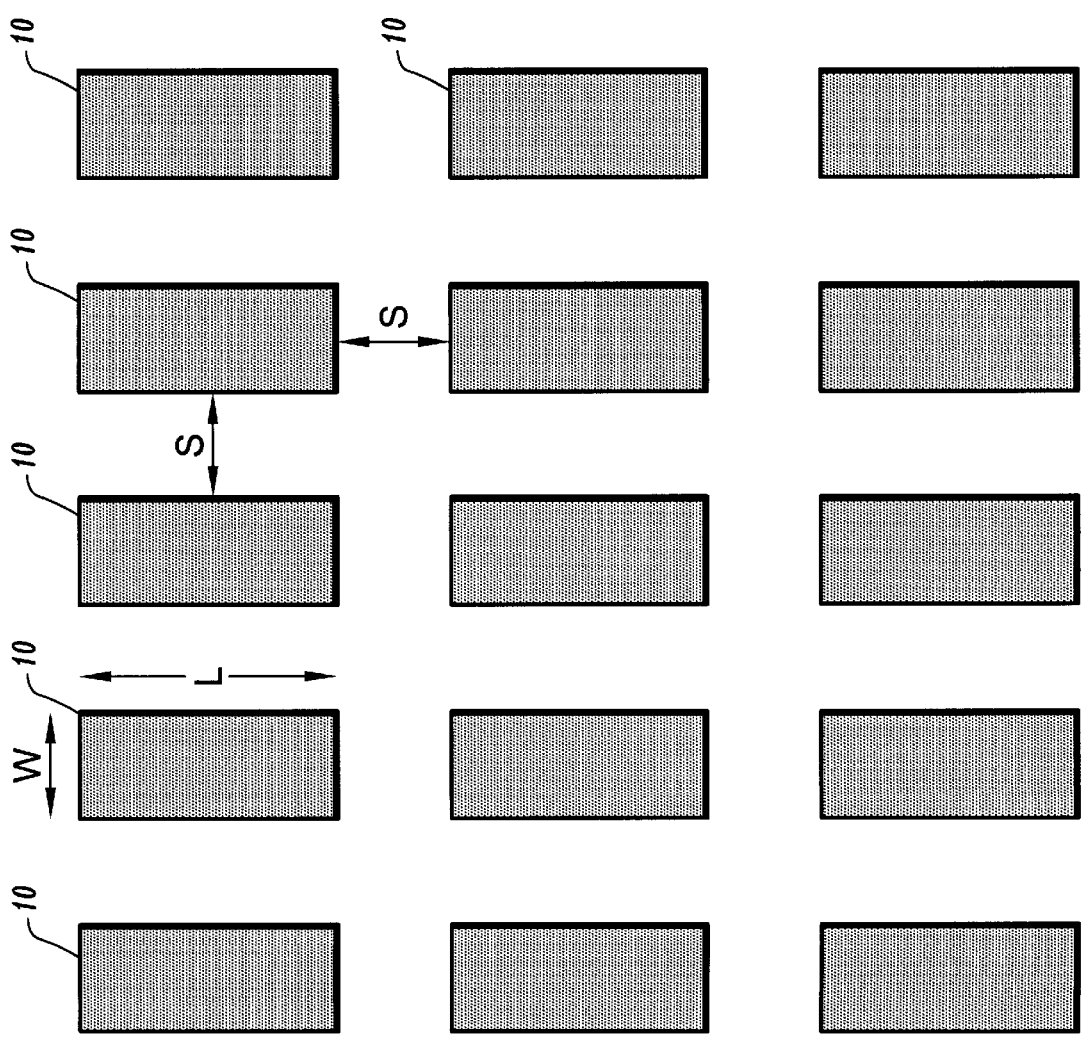
FIG. 1 is a schematic diagram showing deep trench photomask shapes in accordance with the prior art.

Advantageously, dimension B may be reduced for mask 100. In prior art arrangements, B is set based on the image transferred to a resist layer, and ultimately on the dimension of final structure realized in a semiconductor substrate or chip. In FIG. 1, a length L produces an image of about 2 times the minimum feature size F. In accordance with the present invention, B, which is the spacing between trench features 104, may be increased thereby relaxing image placement. Increasing B permits L to be reduced by up to about 20%, and still comply with spacing and trench volume constraints when images employ assist lines of the present invention. In other words, spacing between features 104 may be increased on mask 100, but the projected images result in images with a desired spacing (e.g., 1F) by employing feature 110.

Since B may be significantly reduced in accordance with the invention, image placement is relaxed. This provides a larger process window, increased exposure latitude, depth of focus, and other focus settings are relaxed making it easier to produce reliable and usable images. Illustratively, in the embodiment where feature 110 was employed with a groundrule of 0.135 microns, a 10% increase in the focus/exposure latitude window was achieved! This means the focus adjustment of the image of mask 100 on a resist layer has an increased tolerance of about 10%, making the fabrication process more robust.

Figure 4:
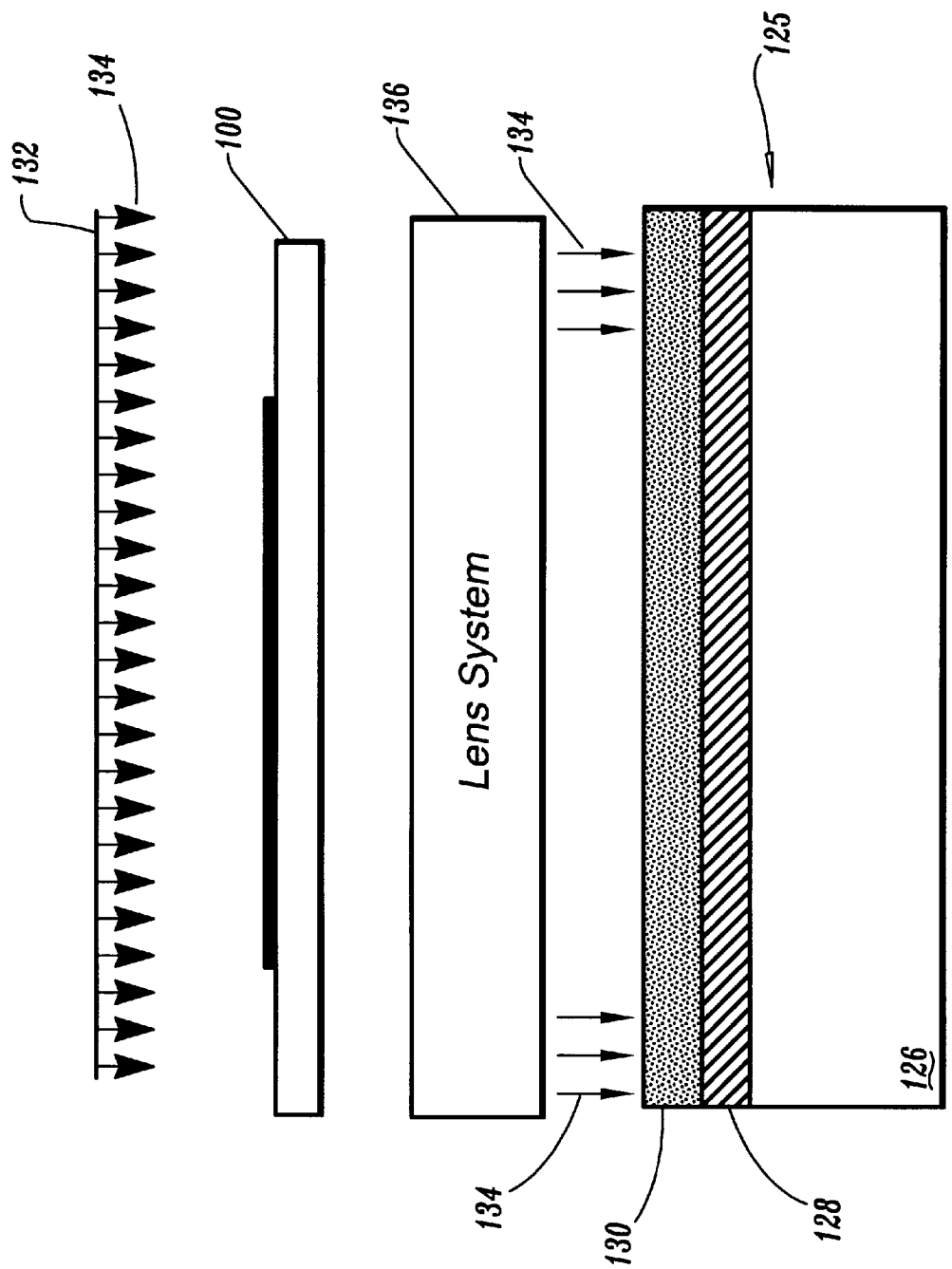
FIG. 4 is a side view showing an exposure of a resist layer employing the photomask of FIG. 3, in accordance with the present invention.

Referring to FIG. 4, a set up for employing mask 100 of the present invention is shown. Mask 100 disposed over a semiconductor wafer or chip 125. In this example, chip 125 includes a substrate 126, dielectric layer(s) 128 and a resist layer 130. Other layers or configurations are also contemplated. Resist layer 130 preferably includes a photoresist layer of a type known in the art. Resist layer 130 is to be patterned by exposing resist layer 130 to light from a light source 132. Light source 132 preferably provides ultraviolet light 134 and more preferably deep ultraviolet light (DUV, e.g., light wavelength of 248 nm). Light 134 passes through mask 100 and a lens system 136, and falls incident on resist layer 130. Lens system 136 expands the image pattern of mask 100 onto resist layer 130 and provides a focus adjustment for light 134.

Light 134 interacts with resist layer 130 to expose resist layer 130 to chemically alter the resist material in accordance with the pattern of mask 100. Resist layer 130 is developed to provides a pattern in resist layer 130.

Figure 5:
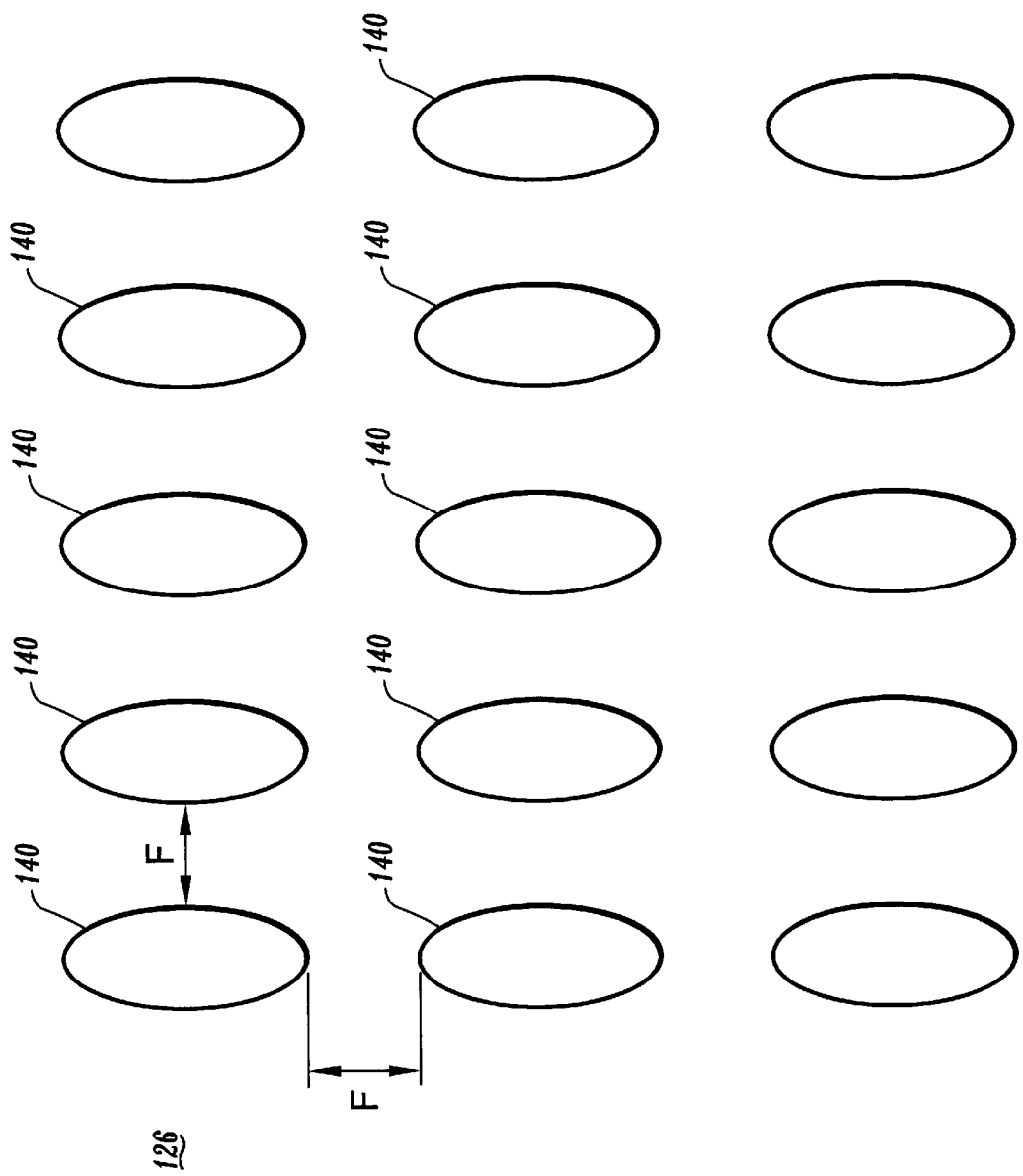
FIG. 5 is a top view of a substrate having structures formed therein in accordance with the photomask of FIG. 3, in accordance with the present invention.

Referring to FIG. 5, resist layer 130 is patterned to form a trench etch mask, and the trench etch mask pattern is transferred to substrate 126 (FIG. 4) by employing an etch process to form trenches 140. Trenches 140 include an aspect ratio, which may be the same as the prior art (FIG. 1), but which is achieved with relaxed image placement accuracy and tolerance. In other embodiments, larger trenches may be desired. and the use of assist line feature 110 in mask 100 (FIG. 3) may be employed to increase the aspect ratio of the images produced by mask 100. For example, an aspect ratio of 2.5 (length to width) of the image may be desired. The aspect ratio may be adjusted by varying the width of feature 110. This may be performed by changing the width of feature 110 on mask 100 or be adjusting the resist image (e.g., by adjusting the focus). Employing feature 110, results in an increased aspect ratio (AR) of deep trenches, e.g., increase length while maintaining width without merging trenches.

Referring to FIG. 6, a feature 200 is shown including an intersection between feature 110 and feature 104 of mask 100. A contrast plot of an image generated by feature 200 is shown in FIG. 7. In one embodiment, an image of a deep trench (or contacts holes) is desired which includes a length (L') of about 2F and a width (W) of about F. A distance between neighboring trenches in both, width and length directions is to be one F. Assuming no image reduction or magnification between the image and the mask features, dimension A of feature 200 is equal to about one F (e.g., A=W) but dimension C is significantly less than 2F, for example, up to about 20% less than 2F. Advantageously, the rendered image of feature 200, as shown in the contrast plot by iso-contrast line 202, is about L' (e.g., 2F) in length and one F in width. By permitting dimension C to be less than the desired dimension, image placement tolerances are relaxed on mask 100 (FIG. 3). For example, dimensions employed for placing features 104 have greater leeway and no longer push the limit of the mask accuracy (i.e., the accuracy limit currently available). In the illustrative example, less accuracy is needed between deep trench structures in the length direction.

The present invention also permits features of a photomask to be placed closer together without overlapping adjacent features. Instead of trying to print two adjacent features as close as possible to each other by using all mask house accuracy for image placement, the shapes or features are connected by a sub-groundrule line shape (e.g., feature 110). As long as a sufficient length of line 110 exists between the adjacent features (e.g., features 104), the image of the features will not connect to each other. A sufficient length of feature 110 between features 104 may include, for example, about 0.5 F or greater in the printed image. This will permit an increase in length of the images of features 110 and not connect these images with each other.

The advantages of the present invention include at least the following aspects:

a) a length of features (e.g., deep trenches) is increased with a single exposure step; and b) relaxation the image placement requirements in terms of accuracy and tolerance.

Referring to FIG. 8, a feature or assist line does not have to run symmetrical through a feature or shape to provide an elongated image. Instead, an assist line 300 may be skewed or placed off-center relative to feature or shape 304 to provide a different image shape. In one example, for the single sided strap structure in a dynamic random access memory, it may be advantageous to have an asymmetric trench shape.

It is to be understood that the present invention may be employed in a plurality of different applications and/or for a plurality of different structures. For example, the present invention may include assist lines, which are oriented in different directions, such as, assist lines, which extend in directions parallel, perpendicular or at angle to features of the mask. In addition, features may include deep trenches, shallow trenches, vias, or any other patterned structure. It is also contemplated that assist lines do not have to extend across all features. Assist lines may be positioned between selected features to relax tolerance for image placement or to extend a length and/or width of a shape.

Having described preferred embodiments for method for increasing trench aspect ratio while relaxing mask fabrication requirements (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A photomask for lithographic processing comprising:

a plurality of features for providing an image pattern, the features being arranged in a column on a mask substrate, each feature dimensioned to provide an individual image separate from all other images provided by the photomask when exposed to light; and a line feature formed on the mask substrate and extending between and intersecting with each of the plurality of features in the column, the line feature for extending a length of images produced by the plurality of features arranged in the column when exposed to light wherein the images produced by each of the plurality of features and the line feature remain separate from each other.

2. The photomask as recited in claim 1, wherein the plurality of features on the substrate are spaced apart from neighboring features in the column by greater than a spacing dimension, and the images produced by the plurality of features appear to have the plurality of features separated by the spacing dimension.

3. The photomask as recited in claim 1, wherein the line feature includes a width to provide an image of less than a groundrule dimension of a given technology.

4. The photomask as recited in claim 1, wherein the plurality of features include patterns for one of forming deep trenches and contact holes.

5. The photomask as recited in claim 1, wherein the line feature includes a width which is discernable in an image of the photomask adjacent to an intersection point between the features and the feature line, but which is not discernable in the image of the photomask at middle portions of spacings between adjacent features in the column.

6. The photomask as recited in claim 1, wherein the plurality of features are symmetrically disposed about the line feature.

7. The photomask as recited in claim 1, wherein the plurality of features are asymmetricaly disposed about the line feature.

8. A photomask for imaging a trench pattern in a resist layer, comprising:

a plurality of trench features arranged in rows and columns on a mask substrate, each feature being dimensioned to provide an individual image separate from all other images provided by the photomask;

line features formed on the mask substrate and extending between each of the trench features in each column, the trench features and the line features comprising an image pattern, wherein upon exposure to light of the image pattern, images of the line features extend a column-wise length of images produced by the trench features while the images of each of the trench features remain separate from each other.

9. The photomask as recited in claim 8, wherein the trench features on the mask substrate are spaced apart from neighboring trench features in the same column by greater than a spacing dimension, and the images produced by the trench features are separated as though the trench features were spaced apart by the spacing dimension.

10. The photomask as recited in claim 9, wherein the spacing dimension includes a groundrule dimension.

11. The photomask as recited in claim 8, wherein the trench features include a length and the images produced by the trench features and the line feature are such that the trench features appear to be up to 20% longer than the length.

12. The photomask as recited in claim 8, wherein the line feature includes a width to provide an image of less than a groundrule dimension of a given technology.

13. The photomask as recited in claim 8, wherein the line features include a width which is discernable in an image of the photomask adjacent to an intersection point between the trench features and the feature line, but which is not discernable in the image of the photomask at middle portions of spacings between adjacent trench features in a same column.

14. The photomask as recited in claim 8, wherein the trench features in a same column are symmetrically disposed about the line feature of the same column.

15. The photomask as recited in claim 8, wherein the trench features in a same column are asymmetrically disposed about the line feature of the same column.

16. A method for relaxing image placement tolerances for a photomask, comprising the steps of:

providing a photomask including a plurality of features for providing an image pattern, the features being arranged in a column on a mask substrate, each feature being dimensioned to provide an individual image separate from all other images provided by the photomask, and a line feature for the image pattern, the line feature being formed on the mask substrate and extending between each of the plurality of features in the column, the line feature for extending images produced by the plurality of features arranged in the column wherein the images of each of the plurality of features remain separate from each other; and directing light through the photomask onto a resist layer to expose the resist layer in accordance with a pattern provided by the photomask, such that images of the plurality of features are extended in the direction of the column due to the line feature.

17. The method as recited in claim 16, wherein the step of providing includes the step of spacing the plurality of features on the substrate from neighboring features in the column by greater than a spacing dimension wherein the images produced by the plurality of features appear to be separated by the spacing dimension.

18. The method as recited in claim 16, wherein the line feature includes a width to provide an image of less than a groundrule dimension of a given technology.

19. The method as recited in claim 16, wherein the plurality of features include patterns for forming one of deep trenches and contacts holes.

20. The method as recited in claim 16, wherein the step of providing includes the step of providing a width of the line feature which is discernable in an image of the photomask adjacent to an intersection point between the features and the feature line, but which is not discernable in the image of the photomask at middle portions of spacings between adjacent features in the column.

21. The method as recited in claim 16, wherein the step of providing includes the seep of providing the plurality of features symmetrically about the line feature.

22. The method as recited in claim 16, wherein the step of providing includes the step of providing the plurality of features asymmetrically about the line feature.

23. The method as recited in claim 16, further comprising the step of adjusting a width of the line feature to alter a length of the plurality of features.

* * * * *